United States Patent

Matsuyama

[11] Patent Number: 6,166,865
[45] Date of Patent: Dec. 26, 2000

[54] PROJECTION OPTICAL SYSTEM AND EXPOSURE APPARATUS

[75] Inventor: Tomoyuki Matsuyama, Tokyo, Japan

[73] Assignee: Nikon Corporation, Tokyo, Japan

[21] Appl. No.: 09/314,608

[22] Filed: May 19, 1999

[51] Int. Cl.[7] .................................................. G02B 15/14
[52] U.S. Cl. ........................ 359/690; 359/691; 359/295; 355/53
[58] Field of Search .................... 359/690, 291, 359/295; 355/53

[56] References Cited

U.S. PATENT DOCUMENTS

| | | | |
|---|---|---|---|
| 5,142,132 | 8/1992 | MacDonald et al. | 250/201.9 |
| 5,451,479 | 9/1995 | Ishibashi | 430/22 |
| 5,793,473 | 8/1998 | Koyama et al. | 355/55 |
| 5,892,597 | 4/1999 | Iwata et al. | 359/11 |

*Primary Examiner*—Georgia Epps
*Assistant Examiner*—Timothy Thompson
*Attorney, Agent, or Firm*—Beyer Weaver & Thomas, LLP

[57] ABSTRACT

A projection optical system for projecting an image of a reticle onto a wafer wherein the first optical element in the projection optical system is a deformable mirror. The deformable mirror deforms into a surface having an aspherical shape. The projection optical system has a reduction ratio in the range of $-\frac{1}{8}X$ to $-\frac{1}{20}X$.

19 Claims, 12 Drawing Sheets

PROJECTION OPTICAL SYSTEM AND EXPOSURE APPARATUS

FIELD OF THE INVENTION

This invention relates generally to a projection optical system for projecting a pattern on a reticle or mask onto a surface such as a wafer. More particularly, this invention relates to a projection optical system that reduces machine to machine distortion matching errors.

BACKGROUND OF THE INVENTION

The demand for higher performance semiconductor devices is continuing and has resulted in a continuing demand for improvements in the art of manufacturing semiconductor devices. One of the most important factors in increasing the performance of a semiconductor device is to increase the speed of the integrated circuits on the semiconductor device. Another of the most important factors in increasing the performance of a semiconductor device is to pack more and more electrical circuits onto a semiconductor device without increasing the size of the device. In order to include as many electrical circuits onto a device of a give size, it is necessary to design and manufacture the electrical circuits with increased density.

In order to manufacture the electrical circuits with increased density it is necessary to improve the projection optical systems used to accurately project the patterns on a reticle, also known as a mask, onto the surface of a substrate, such as a semiconductor wafer. As is known in the semiconductor manufacturing art, a semiconductor wafer is subjected to a multitude of processes. Also, as known in the semiconductor manufacturing art, the processes are not done in a single machine, which necessitates moving the partially completed semiconductor wafer from machine-to-machine. Certain of the machines have projection optical system to project the pattern on a reticle onto the wafer. The projection optical systems typically have differing aberrations and have differing degrees of correction for these aberrations. One such aberration is distortion that can have differing degrees of correction from machine-to-machine. Current projection optical systems only have the capability to adjust magnification of the image and to correct low order distortion. The current projection optical systems do not have any capability to adjust high order distortion including random component of distortion. As a result, a first pattern printed onto a semiconductor wafer in a first machine with a current projection optical system will have a certain amount of distortion in the printed pattern and a second pattern printed onto the semiconductor wafer in a second machine with a current projection optical system will have a certain amount of distortion in the printed pattern, which more than likely will not match the distortion in the first printed pattern. As the printed patterns have been printed closer and closer, a mismatch in distortion in the two machines can cause portions of the two separately printed patterns to not overlap as designed. This results in a failure of the semiconductor device.

Accordingly, there is a need for a projection optical system in which the distortion can be controlled to match the distortion in a previous machine.

SUMMARY OF THE INVENTION

According to the present invention, the foregoing and other objects and advantages are attained by a projection optical system having a deformable mirror as the first optical element following the reticle. The following condition is satisfied on the deformable mirror:

$$0.01 < H1/H0 < 0.22$$

where H1 is the distance between the optical axis and a marginal ray at maximum numerical aperture and H0 is the distance between the optical axis and a chief ray at maximum object height. The projection optical system has a reduction ratio in the range of $-\frac{1}{8}X$ to $-\frac{1}{20}X$.

The projection optical system has a first group of lens elements having a positive refractive power, a second group of lens elements having negative refractive power, a beam splitter, a concave mirror, and a third group of lens elements having positive refractive power.

These and other advantages of the present invention will become more apparent upon a reading of the detailed description of the preferred embodiments that follow, when considered in conjunction with the drawings of which the following is a brief description. It should be clear that the drawings are merely illustrative of the currently preferred embodiments of the present invention, and that the invention is in no way limited to the illustrated embodiments. As will be realized, the invention is capable of other embodiments and its several details are capable of modifications in various obvious aspects, all without departing from the scope of the invention. The present invention is best defined by the claims appended to this specification.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

The following detailed description is of the presently preferred embodiments of the present invention. It is to be understood that while the detailed description is given utilizing the drawings briefly described above, the invention is not limited to the illustrated embodiment. In the detailed description, like reference numbers refer to like elements.

Referring now to the Figures, the embodiments of the present invention will now be described.

Figure 1A:
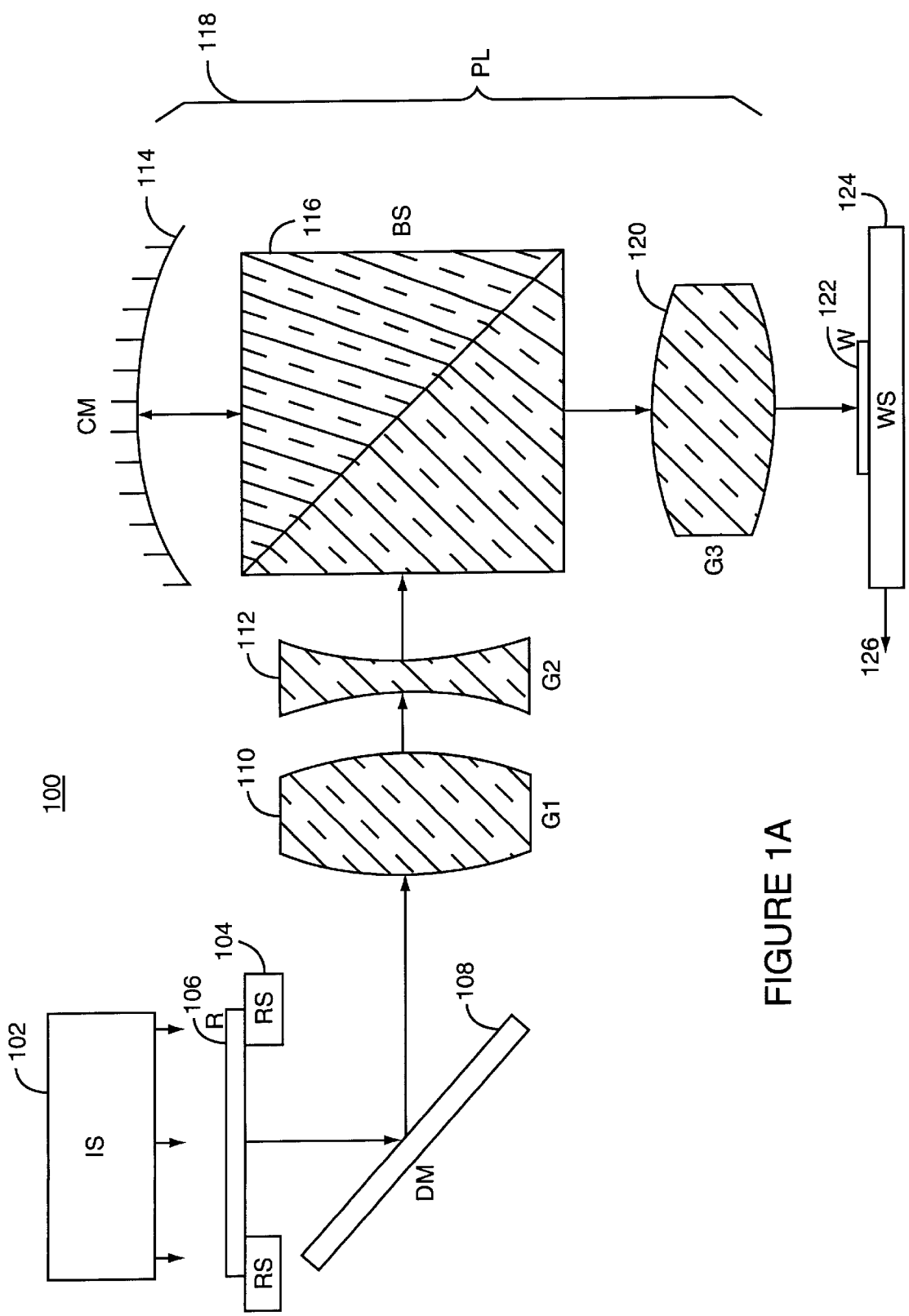
FIG. 1A is a schematic diagram of a projection exposure apparatus to which the projection optical system according to the present invention can be applied.

FIG. 1A is a schematic diagram showing a projection exposure system 100 to which the projection optical system according to the present invention can be applied. An illumination system IS 102 illuminates a reticle R 106 supported on a reticle stage RS 104. As is known in the semiconductor manufacturing art, the reticle 106 has a specified circuit pattern formed on the surface that is to be projected by a projection exposure system PL 118 onto the surface of a wafer 122. The illumination system 102 and reticle 106 causes a defocused image of the pattern on the reticle 106 to be projected onto a deformable mirror DM 108. The defocused image reflected from the deformable mirror 108 is projected through a first group GI of lens elements 110, a second group G2 of lens elements 112 and a through a beam splitter BM 116. The ray bundle passing through the beam splitter 116 is reflected by a concave mirror CM 114 back through the beam splitter 116 and then through a third group G3 of lens elements 120 onto a wafer W 122. The wafer 122 is supported by a wafer stage WS 124. The projection optical system 118 is designed such that an image of the light source 102 is formed within the projection optical system 118 at the pupil position, which is at the position of the aperture stop. Thus, the illumination optical system 102 uniformly illuminates the reticle 106 under the Kohler condition. In projection exposure lithography systems, the Kohler illumination condition is used to provide uniform illumination across the exposure field.

Figure 1B:
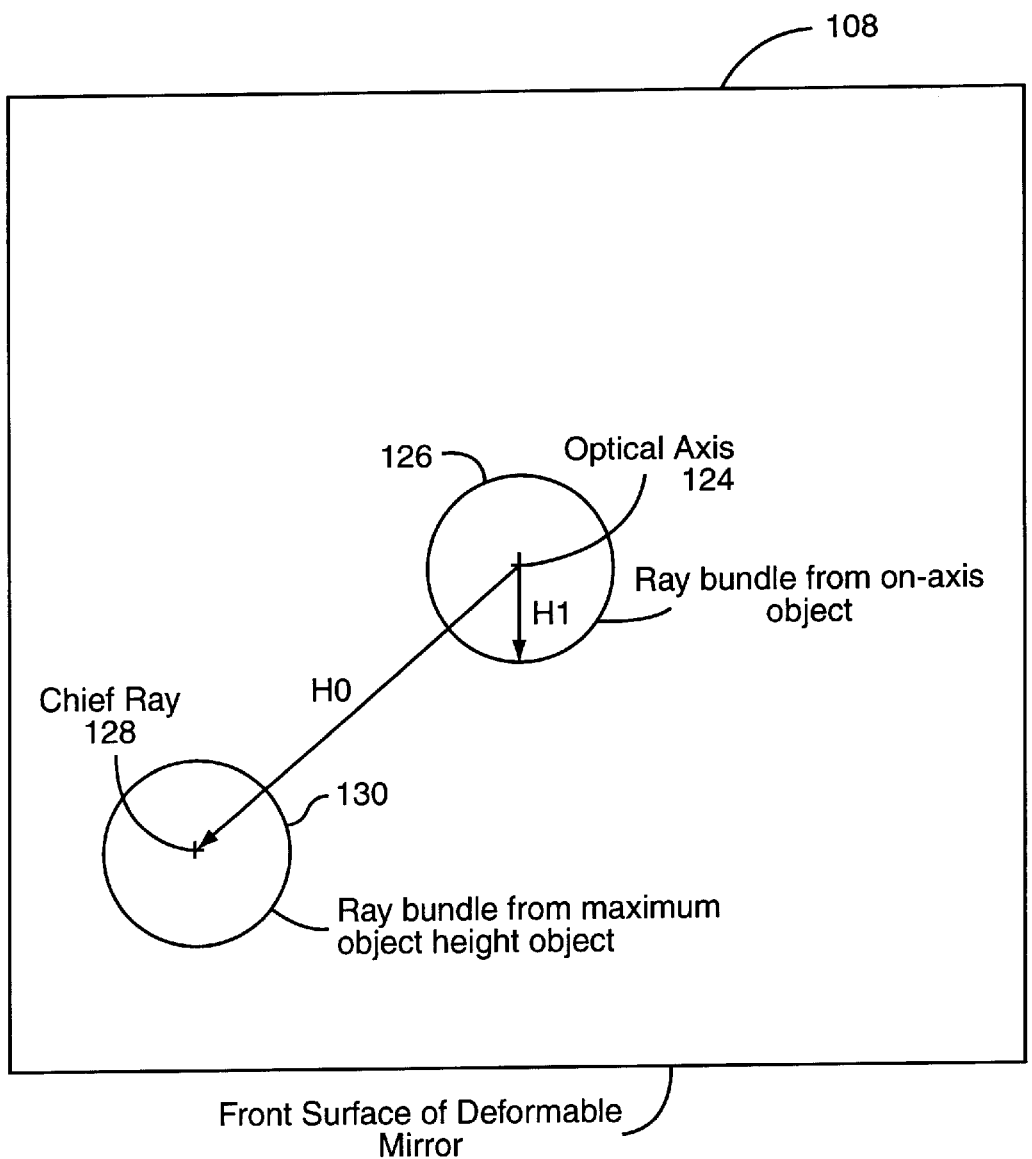
FIG. 1B shows the ray bundle from the maximum object height object and the ray bundle from an on axis object.

Referring to FIG. 1B, the following condition is satisfied on the deformable plane mirror 108 in the projection optical system 100:

$$0.01 < H1/H0 < 0.22, \quad (1)$$

where H1 is the distance between the optical axis 124 and a marginal ray at maximum numerical aperture. The marginal rays at maximum numerical aperture are indicated by the circle 126. H0 is the distance between the optical axis and the chief ray at maximum object height. The ray bundle from the maximum object height object is indicated at 130. The above condition (1) is provided in order to insure that the amount of aberration change other than distortion due to deformation of the deformable mirror (side effects) can be ignored compared to the amount of distortion change due to the deformation of the deformable mirror. If the upper limit is exceeded, the amount of aberration change other than distortion due to deformation of the deformable mirror (side effects) will not be able to be ignored compared tot he amount of distortion change due to the deformation of the deformable mirror. If outside the lower limit, the distance between the reticle 106 and the deformable mirror 108 will be too short to allow the placement of the reticle stage 104 and the deformable mirror 108.

To reduce the amount of the side effects, it is desirable that the numerical aperture at the reticle 106 side be relatively small. However, to get high resolution at the wafer 122, a high resolution at the wafer side is needed. Therefore, the reduction ratio of the optical projection system 118 should be relatively small as compared to conventional reduction ratios of ¼X or ⅕X. A reduction ratio of ½ to ¼ of the conventional reduction ratios of ¼X or ⅕X is appropriate. As a result, reduction ratios in the range of ⅛X, ¹⁄₁₀X, ¹⁄₁₆X or ¹⁄₂₀X are desirable reduction ratios for the present invention.

Figure 2:
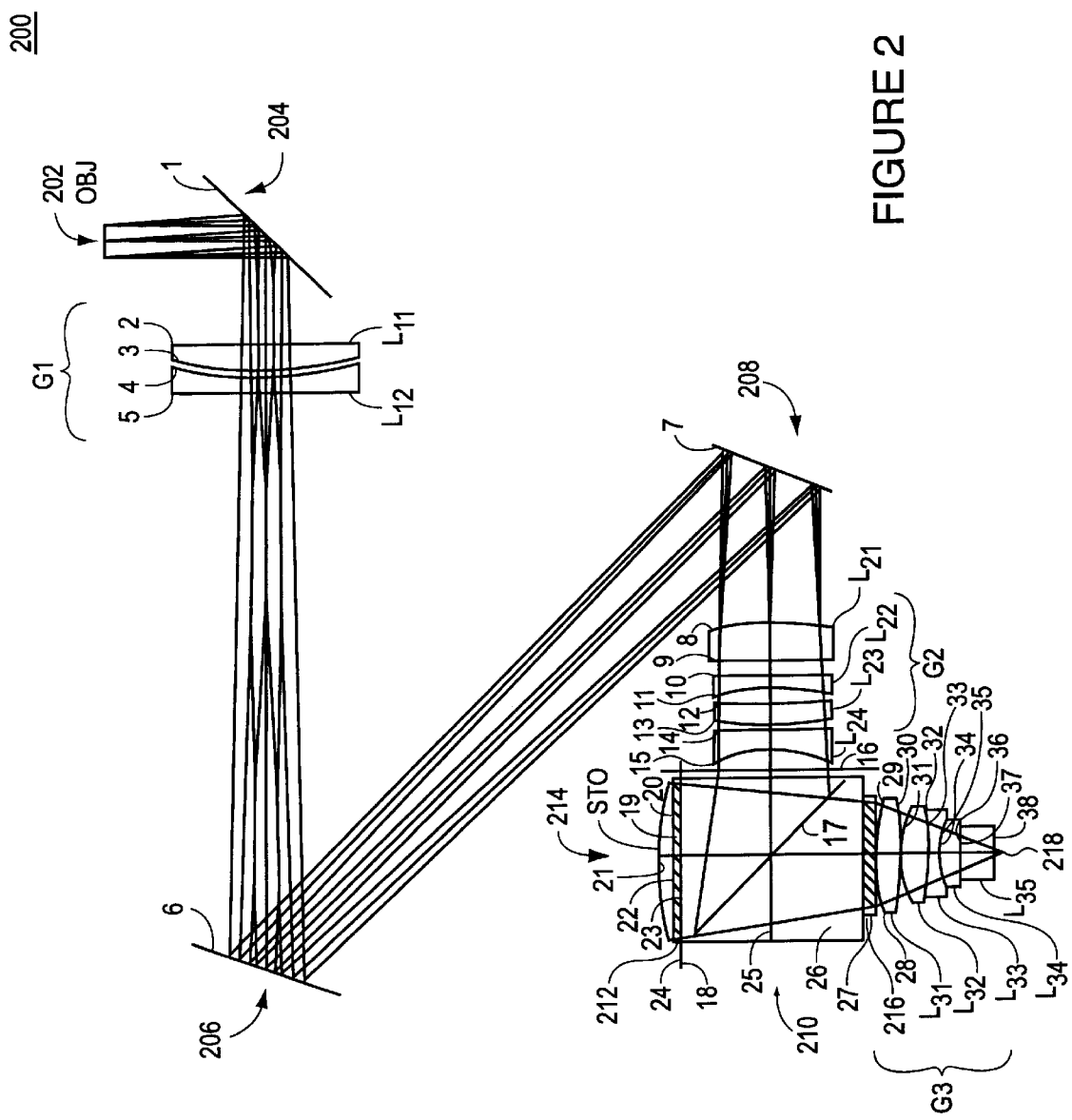
FIG. 2 is a schematic diagram of the projection lens system according to a first embodiment of the present invention.

FIG. 2 shows a first embodiment of a projection optical system 200 in accordance with the present invention. The projection optical system 200 has, in order from the reticle 202 side to the wafer 218 side, a deformable plane mirror 204, a first group G1 of lens elements having a positive refractive power, a first folding mirror 206, a second folding mirror 208, a second group G2 of lens elements having a negative refractive power, a beam splitter 210, a first plane parallel plate 212, a concave mirror 214, a second plane parallel plate 216, and a third group G3 of lens elements having a positive refractive power. The concave mirror 214 acts as an aperture stop.

The first group G1 of lens elements includes, in order from the reticle side, a meniscus lens element $L_{11}$ having a positive refractive power with a convex lens surface 3 facing the image side and a meniscus lens element $L_{12}$ having a negative refractive power with a concave lens surface 4 facing the reticle side.

The second group G2 of lens elements includes, in order from the reticle side, a double convex lens element $L_{21}$ with a stronger convex lens surface 8 facing the reticle side, a meniscus lens element $L_{22}$ having a negative refractive power with a concave lens surface 11 facing the wafer side, a meniscus lens element $L_{23}$ having a positive refractive power with a convex lens surface 13 facing the wafer side and a double convex lens element $L_{24}$.

The third group G3 of lens elements includes, in order from the reticle side, a double convex lens element $L_{31}$ with a stronger convex lens surface 29 facing the reticle side, a double convex lens element $L_{32}$ with a stronger convex lens surface 31 facing the reticle side, a double concave lens element $L_{33}$ with a stronger concave lens surface 34 facing the wafer side, a meniscus lens element $L_{34}$ having a positive refractive power with a convex lens surface 35 facing the reticle side, and a plano-convex lens element $L_{35}$ with a convex lens surface 37 facing the reticle side.

In order to show the effect of the deformable mirror, the deformable mirror 204 is deformed to have an aspherical surface in accordance with the following relationship:

$$z=[(\text{Curvature})h^2]/[1+\{1-(1+k)^2h^2\}^{1/2}]+Ah^4+Bh^6+Ch^8+Dh^{10}+Eh^{12}+Fh^{14}$$

where z is the sag of the surface parallel to the z axis where the z axis is coincident with the optical axis, $h^2=x^2+y^2$ where the x and y axes are in directions orthogonal to the z axis, and thus to the optical axis, where the Curvature=1/r, where r is the paraxial radius of curvature, and the aspherical surface coefficients are A, B, C, D, E, and F and k is the conic constant. An example of the aspherical constants for the deformable mirror are as follows:

$$k = 0,$$

$$A = 0.178469E - 20 \quad B = 0.147865E - 16 \quad C = -0.350644E - 20$$

-continued $D = 0.237279E-24$   $E = -0.642789E-29$   $F = 0.612435E-34$

The condition H1/H0=0.086. It should be appreciated that the deformable mirror can be deformed to any kind of shape having different aspherical constants.

Figure 3:
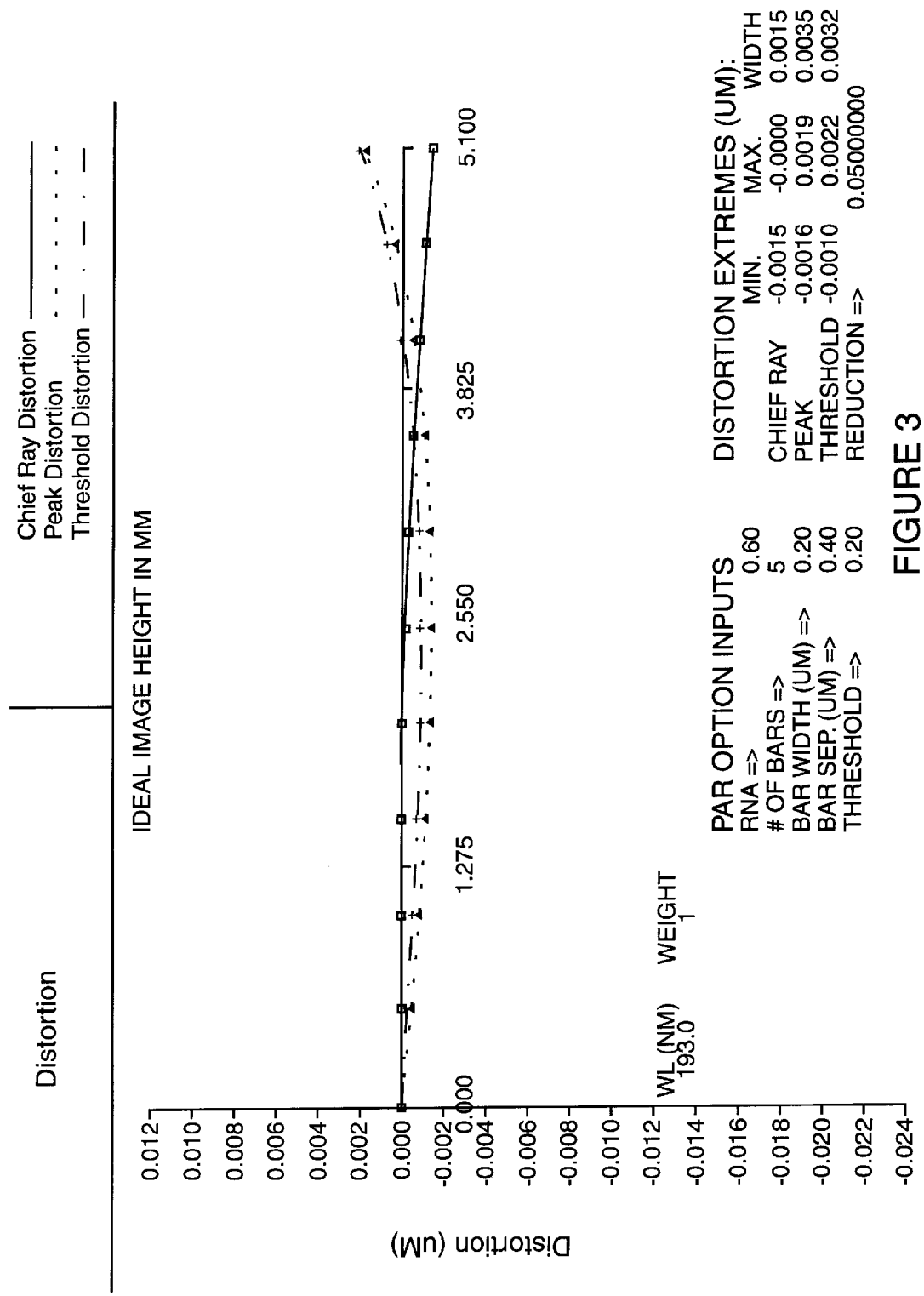
FIG. 3 shows the distortion of the projection exposure system shown in FIG. 2 before deforming the deformable mirror.

FIG. 3 shows the distortion of the projection exposure system 200 before deforming the deformable mirror 204.

Figure 4:
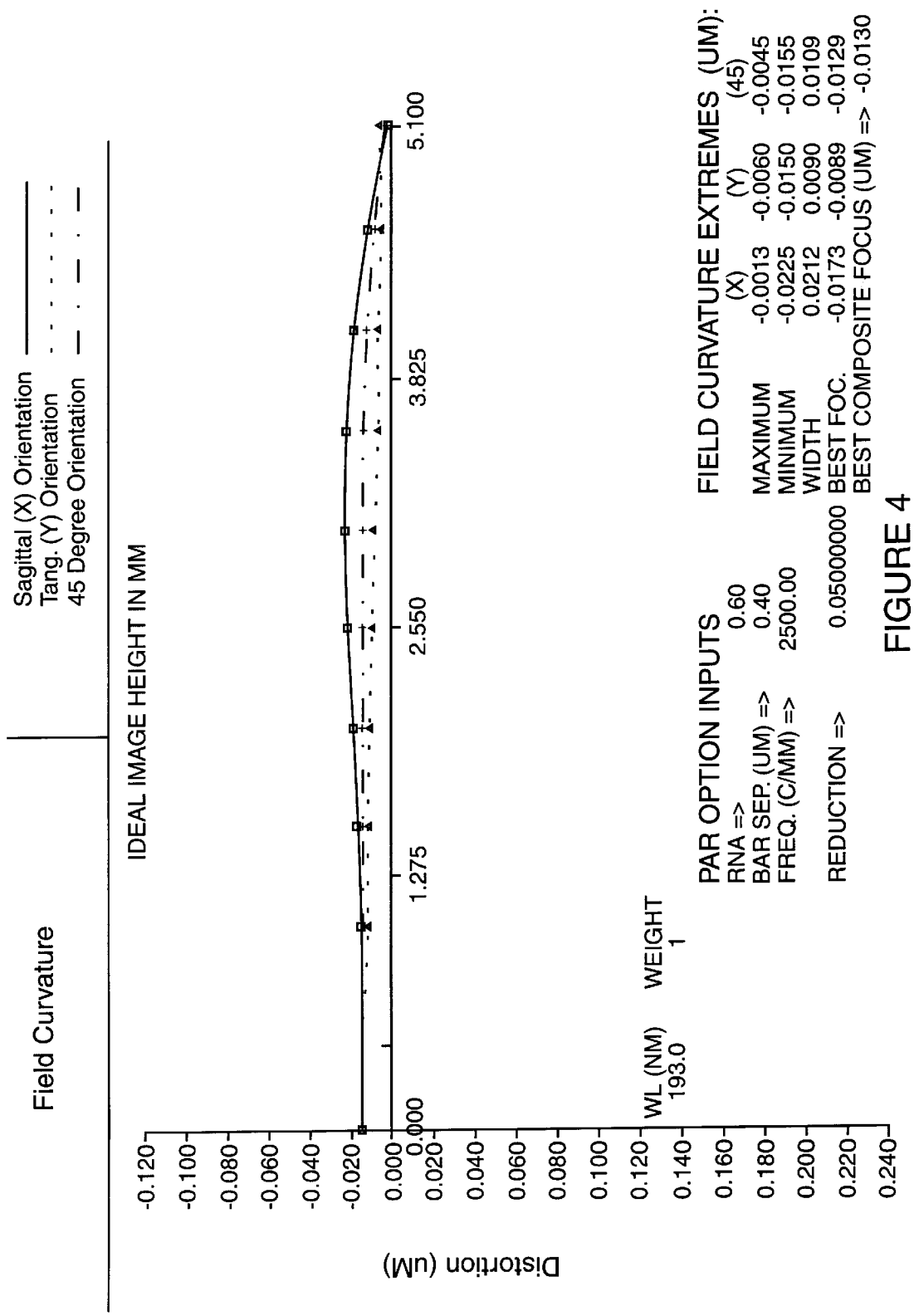
FIG. 4 shows the field curvature of the projection exposure system shown in FIG. 2 before deforming the deformable mirror.

FIG. 4 shows the field curvature of the projection exposure system 200 before deforming the deformable mirror 204.

Figure 5:
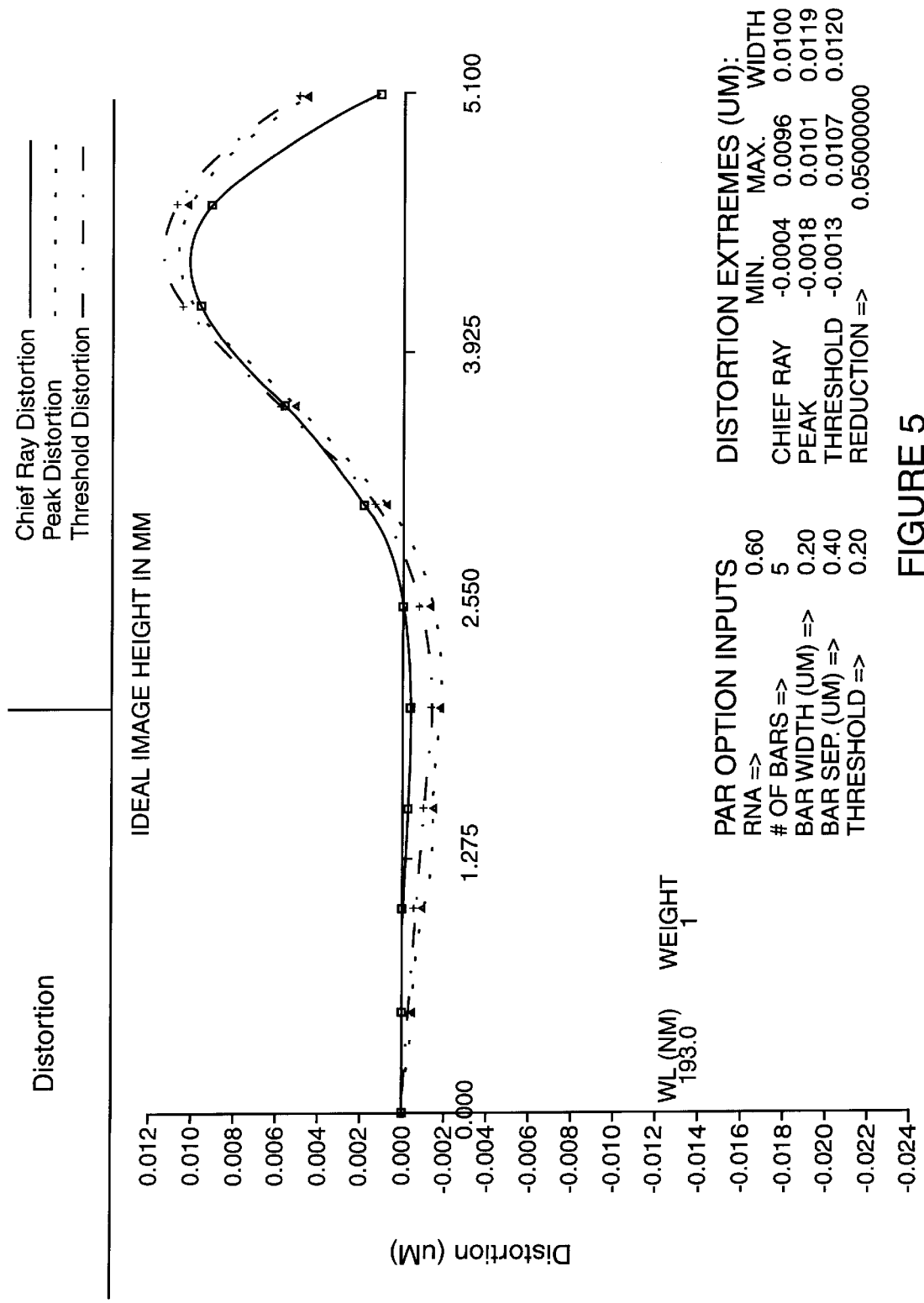
FIG. 5 shows the distortion of the projection exposure system shown in FIG. 2 after deforming the deformable mirror.

FIG. 5 shows the distortion of the projection exposure system 200 after deforming the deformable mirror 204. The amount of the distortion change is approximately 10 nanometers. As can be seen, the distortion can be controlled by changing the shape of the surface of the deformable mirror 204.

Figure 6:
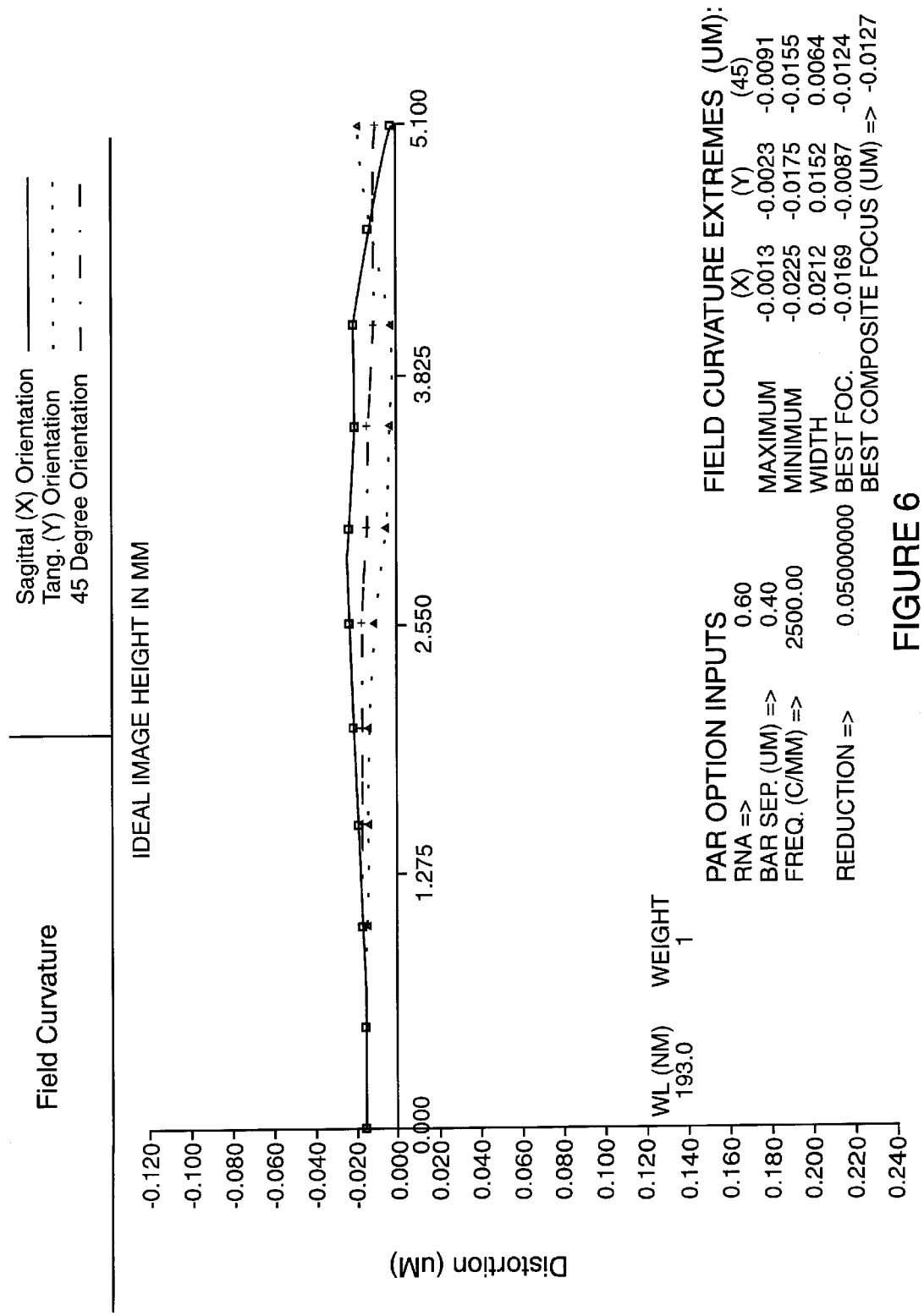
FIG. 6 shows the field curvature of the projection exposure system shown in FIG. 2 after deforming the deformable mirror.

FIG. 6 shows the field curvature of the projection exposure system 200 after deforming the deformable mirror 204. As can be seen by comparing the field curvature shown in FIG. 4 with the field curvature shown in FIG. 6, the deformation of the deformable mirror 204 does not appreciably affect the field curvature. As can be seen by comparing the Strehl ratio intensity in Table 2 with the Strehl ratio intensity in Table 3, the deformation of the deformable mirror 204 does not appreciably affect the Strehl ratio intensity. The Strehl ratio is a simple theoretical description of the degree of perfection in an image. The Strehl ratio is the ratio of the intensity at the center of the diffraction image to the intensity that would be present if no aberration were present. Although the evaluation of the quality of an image by an observer does not correlate very well with this measure, it is a good indicator of the degree of perfection for lens systems that are very close to diffraction limited.

Table 1 below shows the values of specifications for the above first embodiment. The numbers in the left column indicate the order of optical surfaces from the object (reticle) side to the image (wafer) side. The quantity r is the curvature radius, in millimeters, of the lens surface. The quantity d is the axial distance, in millimeters, to the next lens surface. ADE indicates the surface tilt in degrees. ASP indicates the aspherical surface, "Refl" indicates reflection and STO indicates aperture stop. The aspheric constants are the constants in the equation defining the shape of the aspherical surface as follows:

$$z=[(\text{Curvature})h^2]/[1+\{1-(1+k)^2h^2\}^{1/2}]+Ah^4+Bh^6+Ch^8+Dh^{10}+Eh^{12}+Fh^{14}$$

where the parameters are the same as defined above.

TABLE 1

Numerical aperture = 0.70
Image field size = 10mm x 2mm (Maximum image height = 5.1mm.)
Reduction Ratio = -1/20,
Index of silica glass = 1.560815, index of $CaF_2$ = 1.501821
Wavelength = 193 nanometers

| Surface number | Radius of curvature (r) mm | axial distance (d) mm | material |
|---|---|---|---|
| OBJ | INFINITY | 200.000000 | |
| 1(Refl) | INFINITY | -136.733782 | |
| | ADE: 45.000000 | | |
| 2 | 2873.00856 | -30.000000 | quartz |
| 3 | 515.94693 | -5.711427 | |
| 4 | 553.84487 | -30.000000 | $CaF_2$ |
| 5 | 1109.79859 | -762.485122 | |
| 6(Refl) | INFINITY | 900.000000 | |

TABLE 1-continued

Numerical aperture = 0.70
Image field size = 10mm x 2mm (Maximum image height = 5.1mm.)
Reduction Ratio = -1/20,
Index of silica glass = 1.560815, index of $CaF_2$ = 1.501821
Wavelength = 193 nanometers

| Surface number | Radius of curvature (r) mm | axial distance (d) mm | material |
|---|---|---|---|
| | ADE:-22.500000 | | |
| 7(Refl) | INFINITY | -206.959702 | |
| | ADE: 22.000000 | | |
| 8 | -601.70031 | -45.111440 | quartz |
| 9 | 2832.19851 | -18.477083 | |
| 10 | -7505.13187 | -20.000000 | $CaF_2$ |
| 11 | -239.93427 | -15.197958 | |
| 12 | 1153.97983 | -31.456988 | quartz |
| 13 | 408.97044 | -9.098128 | |
| 14 | 3850.30799 | -30.000000 | $CaF_2$ |
| 15 | -191.47857 | -23.557369 | |
| 16 | INFINITY | -115.000000 | quartz |
| 17(Refl) | INFINITY | 115.000000 | quartz |
| | ADE: 45.000000 | | |
| 18 | INFINITY | 2.000000 | |
| 19 | INFINITY | 6.000000 | quartz |
| 20 | INFINITY | 18.163600 | |
| 21(STO)(Refl) | -479.24770 | -18.163600 | |
| Aspherical | | | |
| k = 0.000000 | | | |
| A = 0.537389E-11 | B = 0.140230E-13 | C = 0.444964E-18 | |
| D = 0.425404E-23 | E = 0.517653E-27 | F = 0.105703E-31 | |
| G = 0.000000 | H = 0.0000000 | J = 0.000000 | |
| 22 | INFINITY | -6.000000 | quartz |
| 23 | INFINITY | -2.000000 | |
| 24 | INFINITY | -115.000000 | quartz |
| 25 | INFINITY | -115.000000 | quartz |
| 26 | INFINITY | -2.000000 | |
| 27 | INFINITY | -14.955793 | quartz |
| 28 | INFINITY | -0.500000 | |
| 29 | -279.79915 | -29.279630 | quartz |
| 30 | 665.85267 | -0.500016 | |
| 31 | -131.55884 | -33.428186 | $CaF_2$ |
| 32 | 700.89384 | -0.534058 | |
| 33 | 587.84105 | -14.999815 | quartz |
| 34 | -119.11715 | -0.623858 | |
| 35 | -116.26150 | -22.362792 | $CaF_2$ |
| 36 | -506.54970 | -0.500383 | |
| 37 | -151.93557 | -44.773484 | quartz |
| 38 | INFINITY | -9.999992 | |
| IMG | INFINITY | 0.000000 | |

Table 2 below shows the wave front aberration of the first embodiment before deforming the deformable plane mirror 104.

TABLE 2

Best Individual Focus

| Field Fract. | Focus (mm) | RMS(waves) | STREHL* |
|---|---|---|---|
| X 0.00 | | | |
| Y 0.00 | -0.000018 | 0.003 | 1.000 |
| X 0.00 | | | |
| Y 0.10 | -0.000018 | 0.003 | 1.000 |
| X 0.00 | | | |
| Y 0.20 | -0.000018 | 0.004 | 0.999 |
| X 0.00 | | | |
| Y 0.30 | -0.000018 | 0.004 | 0.999 |
| X 0.00 | | | |
| Y 0.40 | -.000019 | 0.005 | 0.999 |
| X 0.00 | | | |
| Y 0.50 | -.000019 | 0.005 | 0.999 |
| X 0.00 | | | |
| Y 0.60 | -.000018 | 0.006 | 0.998 |
| X 0.00 | | | |
| Y 0.70 | -.000017 | 0.007 | 0.998 |
| X 0.00 | | | |

TABLE 2-continued

Best Individual Focus

| Field Fract. | Focus (mm) | RMS(waves) | STREHL* |
|---|---|---|---|
| Y 0.80 X 0.00 | −.000015 | 0.007 | 0.998 |
| Y 0.90 X 0.00 | −.000012 | 0.007 | 0.998 |
| Y 1.00 | −.000007 | 0.008 | 0.998 |

*STREHL is the intensity at the peak of the point image as a fraction of the peak of the aberration-free image with the same vignetting and obscuration. The approximation used here is generally valid for RMS < 0.1.

Table 3 below shows the wave front aberration of the first embodiment after deforming the deformable plane mirror 104.

TABLE 3

Best Individual Focus

| Field Fraction | Focus (mm) | RMS (waves) | STREHL |
|---|---|---|---|
| X 0.00 Y 0.00 | −0.000018 | 0.003 | 1.000 |
| X 0.00 Y 0.10 | −0.000018 | 0.003 | 1.000 |
| X 0.00 Y 0.20 | −0.000018 | 0.004 | 0.999 |
| X 0.00 Y 0.30 | −0.000018 | 0.004 | 0.999 |
| X 0.00 Y 0.40 | −0.000019 | 0.005 | 0.999 |
| X 0.00 Y 0.50 | −0.000018 | 0.006 | 0.999 |
| X 0.00 Y 0.60 | −0.000017 | 0.007 | 0.998 |
| X 0.00 Y 0.70 | −0.000014 | 0.008 | 0.998 |
| X 0.00 Y 0.80 | −0.000013 | 0.008 | 0.998 |
| X 0.00 Y 0.90 | −0.000015 | 0.007 | 0.998 |
| X 0.00 Y 1.00 | −0.000013 | 0.008 | 0.997 |

Figure 7:
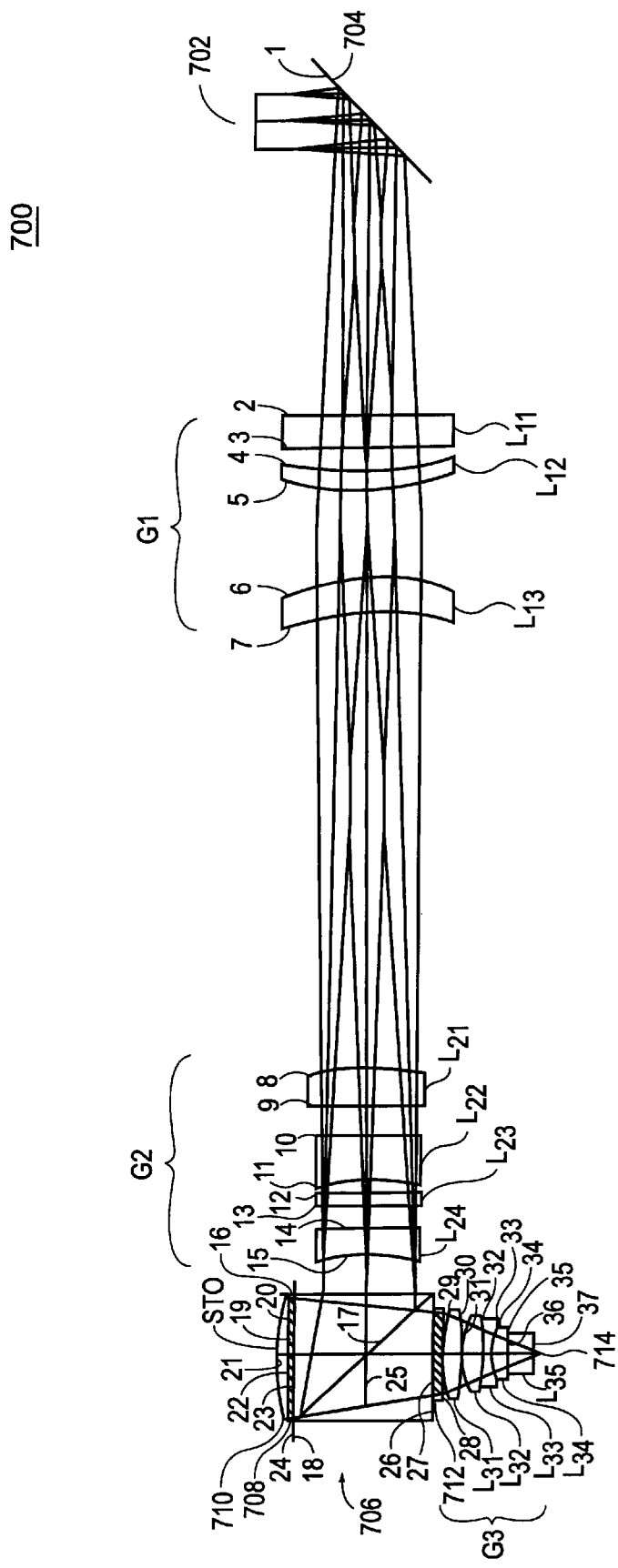
FIG. 7 is a schematic diagram of the projection lens system according to a second embodiment of the present invention.

FIG. 7 shows a second embodiment of a projection optical system 700 in accordance with the present invention. The projection optical system 700 has, in order from the reticle 702 side to the wafer 714 side, a deformable mirror 704, a first group G1 of lens elements having a positive refractive power, a second group G2 of lens elements having a negative refractive power, a beam splitter 706, a plane parallel plate 708, a concave mirror 710, a plane parallel plate 712, and a third group G3 of lens elements having a positive refractive power. The concave mirror 710 acts as an aperture stop.

The first group G1 of lens elements includes, in order from the reticle side, a double convex lens element $L_{11}$ with a stronger convex lens surface 2 facing the reticle side, a meniscus lens element $L_{12}$ having a positive refractive power with a convex lens surface 5 facing the wafer side and a meniscus lens element $L_{13}$ having a positive refractive power with a convex lens surface 6 facing the reticle side.

The second group G2 of lens elements includes, in order from the reticle side, a meniscus lens $L_{21}$ having a positive refractive power with a convex lens surface 8 facing the reticle side, a double concave lens element $L_{22}$ with a stronger concave surface 11 facing the wafer side, a double convex lens element $L_{23}$ with a stronger convex surface facing the 13 facing the wafer side, and a meniscus lens element $L_{24}$ having a negative refractive power with a concave lens surface 15 facing the wafer side.

The third group G3 of lens elements includes, in order from the reticle side, a meniscus lens element $L_{31}$ having a positive refractive power with a convex lens surface 29 facing the reticle side, a double convex lens element $L_{32}$ with a stronger convex lens surface 31 facing the reticle side, a double concave lens element $L_{33}$ (lens elements $L_{32}$ and $L_{33}$ are cemented) with a stronger concave lens surface 33 facing the wafer side, a meniscus lens element $L_{34}$ having a positive refractive power with a convex lens surface 34 facing the reticle side, and a double convex lens element $L_{35}$ with a stronger lens surface 36 facing the reticle side.

In order to show the effect of the deformable mirror, the deformable mirror 704 is deformed to have an aspherical surface in accordance with the following relationship:

$$z=[(\text{Curvature})h^2]/[1+\{1-(1+k)^2\}h^{1/2}]+Ah^4+Bh^6+Ch^8+Dh^{10}+Eh^{12}+Fh^{14}$$

where the parameters are the same as defined above. The aspherical constants are as follows.

$k = 0$, $A = 0.534944E - 20$  $B = 0.767333E - 16$  $C = -0.315034E - 19$ $D = 0.369082E - 23$  $E = -0.173103E - 27$  $F = 0.285542E - 32$.

The condition H1/H0=0.130.

Figure 8:
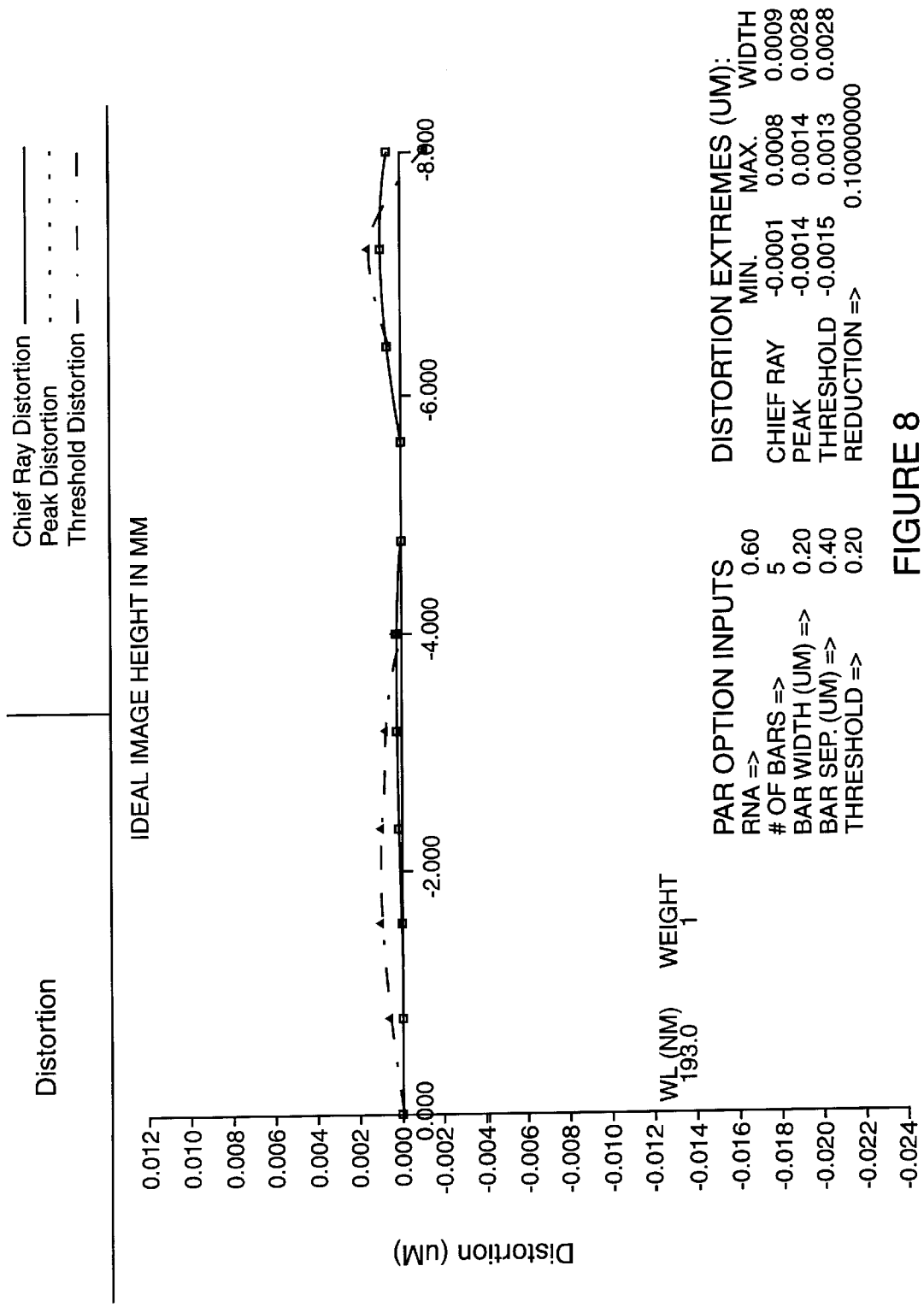
FIG. 8 shows the distortion of the projection exposure system shown in FIG. 7 before deforming the deformable mirror.

FIG. 8 shows the distortion of the projection exposure system 700 before deforming the deformable mirror 704.

Figure 9:
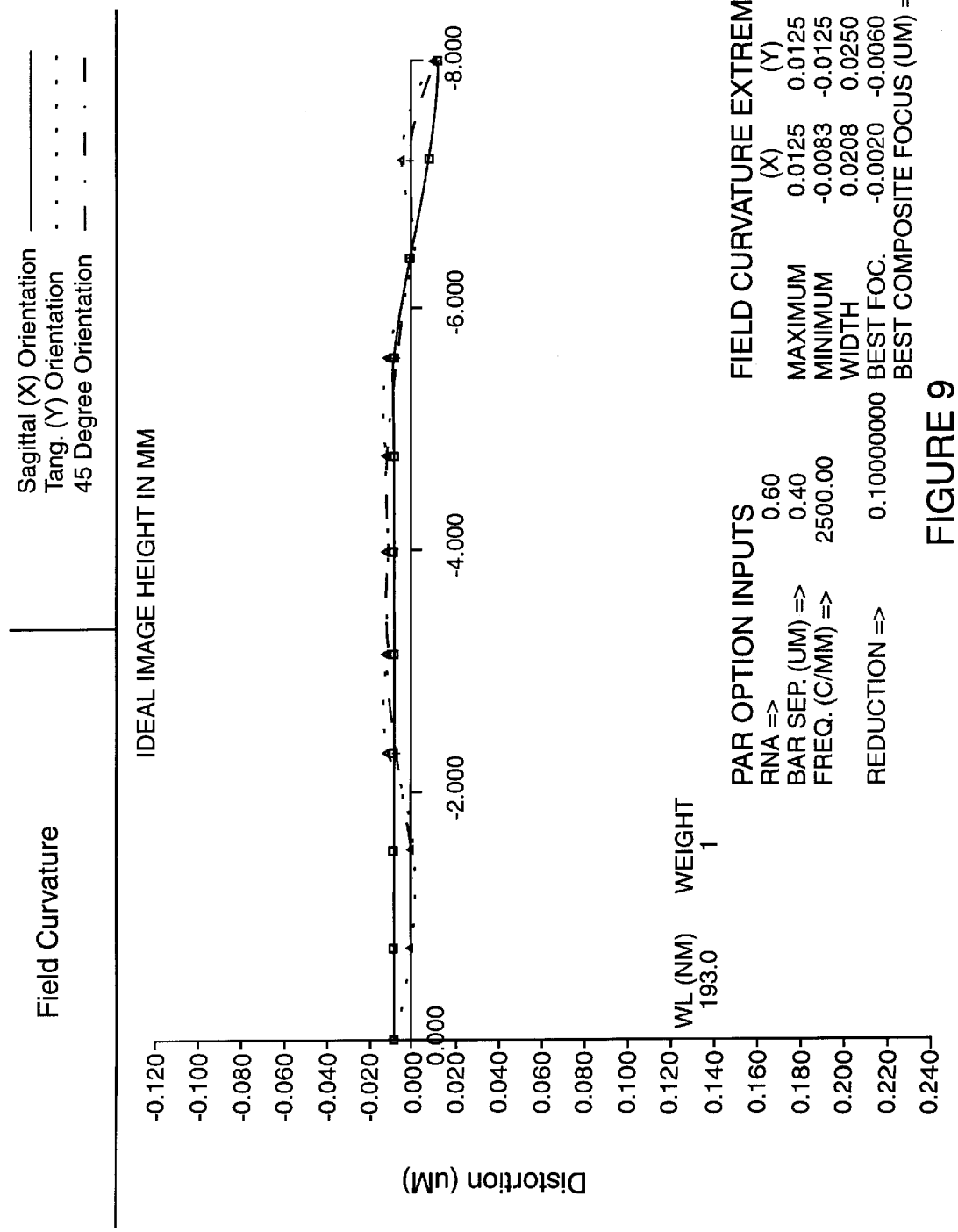
FIG. 9 shows the field curvature of the projection exposure system shown in FIG. 7 before deforming the deformable mirror.

FIG. 9 shows the field curvature of the projection exposure system 700 before deforming the deformable mirror 704.

Figure 10:
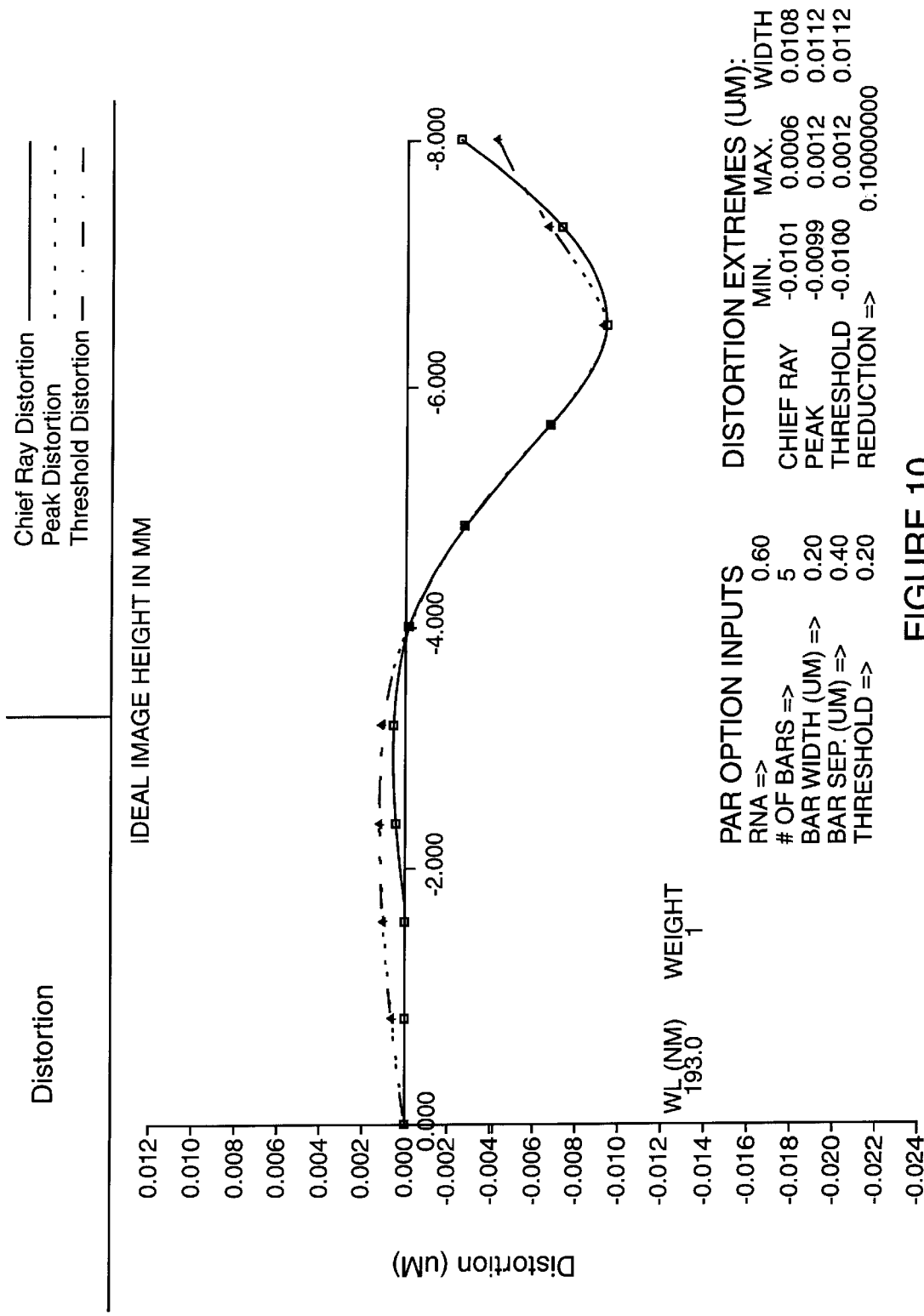
FIG. 10 shows the distortion of the projection exposure system shown in FIG. 7 after deforming the deformable mirror.

FIG. 10 shows the distortion of the projection exposure system 700 after deforming the deformable mirror 704. The amount of the distortion change is approximately 10 nanometers. As can be seen, the distortion can be controlled by changing the shape of the surface of the deformable mirror 704.

Figure 11:
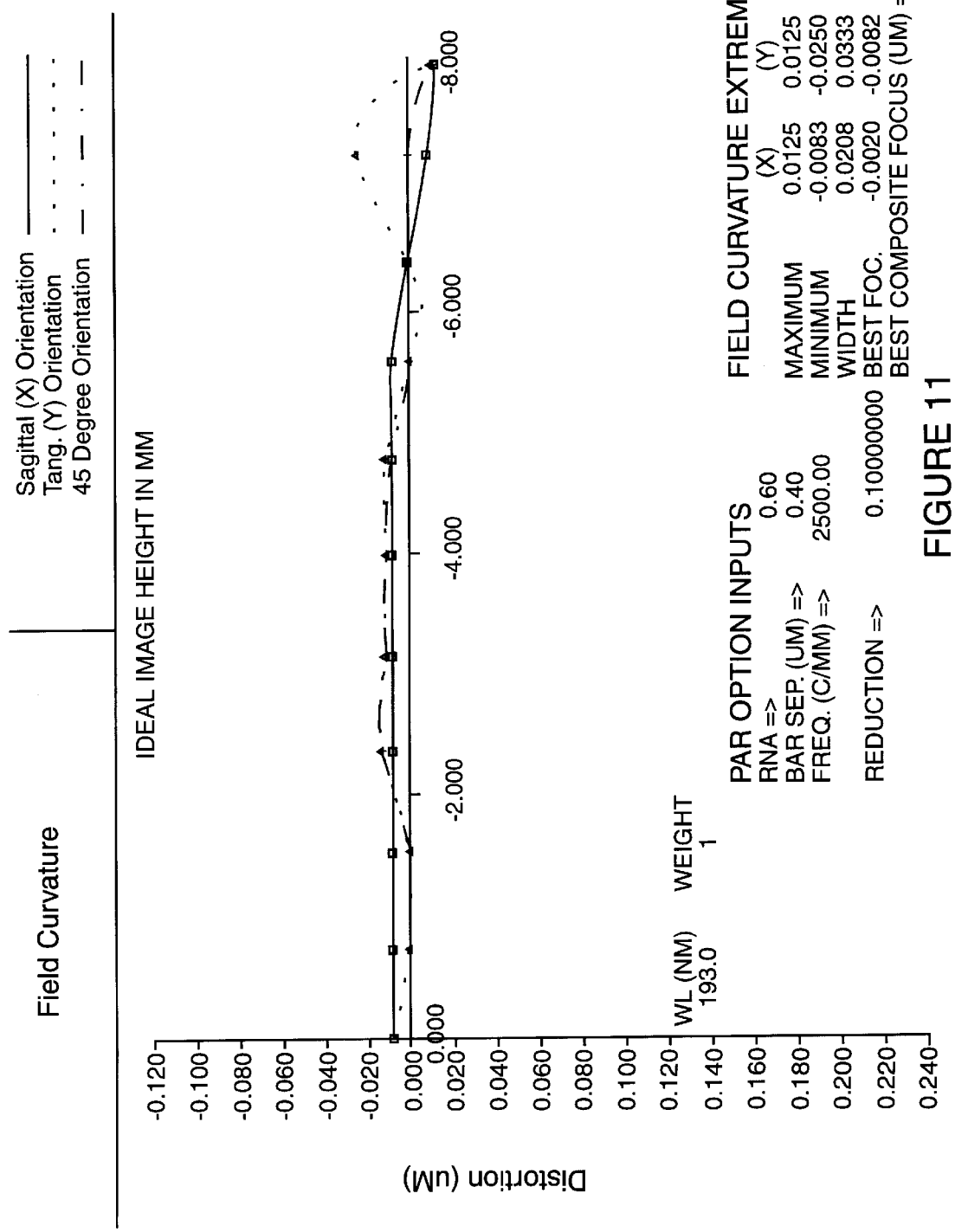
FIG. 11 shows the field curvature of the projection exposure system shown in FIG. 7 after deforming the deformable mirror.

FIG. 11 shows the field curvature of the projection exposure system 700 deforming the deformable mirror 704. As can be seen by comparing the field curvature shown in FIG. 9 with the field curvature shown in FIG. 11, the deformation of the deformable mirror 704 does not appreciably affect the field curvature. As can be seen by comparing the Strehl ratio intensity in Table 5 with the Strehl ratio intensity in Table 6, the deformation of the deformable mirror 704 does not affect the Strehl ratio intensity.

Table 4 below shows the values of specifications for the above second embodiment. The parameters are the same as described above in conjunction with Table 1.

TABLE 4

Numerical aperture = 0.55
Image field size = 14mm x 7mm (Maximum image height = 7.8mm)
Reduction Ratio = −1/10,
Index of silica glass = 1.560815, index of $CaF_2$ = 1.501821
Wavelength = 193 nanometers

| Surface number | Radius of curvature (r) mm | axial distance (d) mm | material |
|---|---|---|---|
| OBJ | INFINITY | 150.000000 | |
| 1(Refl.) | INFINITY ADE: 45.000000 | −393.918066 | |
| 2 (Asp.) | −5463.62228 | −48.496219 | quartz |
| k = 0.000000 | | | |
| A = 0.193752E-08 | B = 0.382797E-14 | C = −0.150553E-18 | |
| D = 0.420608E-23 | E = 0.725294E-27 | F = −0.546482E-31 | |
| G = 0.000000 | H = 0.000000 | J = 0.000000 | |

TABLE 4-continued

Numerical aperture = 0.55
Image field size = 14mm x 7mm (Maximum image height = 7.8mm)
Reduction Ratio = −1/10,
Index of silica glass = 1.560815, index of $CaF_2$ = 1.501821
Wavelength = 193 nanometers

| Surface number | Radius of curvature (r) mm | axial distance (d) mm | material |
|---|---|---|---|
| 3 | 7986.07456 | −30.303188 | |
| 4 | 474.24333 | −25.188511 | quartz |
| 5 | 374.89052 | −120.347314 | |
| 6 (Asp.) | −297.42648 | −50.000000 | quartz |
| k = 0.000000 | | | |
| A = 0.238508E-09 | B = 0.458899E-14 | C = 0.356834E-18 | |
| D = −0.278348E-22 | E = 0.135280E-26 | F = −0.156784E-31 | |
| G = 0.000000 | H = 0.000000 | J = 0.000000 | |
| 7 | −347.21725 | −618.431899 | |
| 8 | −457.05541 | −49.363302 | quartz |
| 9 | −5704.04059 | −41.730072 | |
| 10 | 602.49909 | −62.092761 | $CaF_2$ |
| 11 | −201.71689 | −13.348380 | |
| 12 | −1143.54695 | −20.003926 | quartz |
| 13 | 740.99670 | −32.000000 | |
| 14 | −454.69919 | −36.680745 | $CaF_2$ |
| 15 | −187.89617 | −20.501400 | |
| 16 | INFINITY | −81.755300 | quartz |
| 17(Refl.) | INFINITY | 81.755300 | quartz |
| | ADE: 45.000000 | | |
| 18 | INFINITY | 2.000000 | |
| 19 | INFINITY | 6.000000 | quartz |
| 20 | INFINITY | 18.163600 | |
| 21(Refl.)(Sto) | −421.41912 | −18.163600 | |
| Aspherical | k = 0.000000 | | |
| A = −0.227920E-08 | B = −0.415470E-13 | C = −0.849648E-18 | |
| D = 0.431664E-23 | E = −0.274742E-26 | F = 0.129766E-30 | |
| G = 0.000000 | H = 0.000000 | J = 0.000000 | |
| 22 | INFINITY | −6.000000 | quartz |
| 23 | INFINITY | −2.000000 | |
| 24 | INFINITY | −81.755300 | quartz |
| 25 | INFINITY | −81.755300 | quartz |
| 26 | INFINITY | −2.000000 | |
| 27 | INFINITY | −9.774907 | quartz |
| 28 | INFINITY | −0.953278 | |
| 29 | −129.16693 | −25.794848 | quartz |
| 30 | −581.31511 | −0.684460 | |
| 31 | −134.38930 | −23.425872 | $CaF_2$ |
| 32 | 282.61007 | −15.186739 | quartz |
| 33 | −86.78179 | −5.147929 | |
| 34 | −109.54035 | −23.456668 | quartz |
| 35 | −534.44570 | −0.528693 | |
| 36 | −117.81961 | −42.927050 | $CaF_2$ |
| 37 | 2613.11741 | −3.976439 | |
| IMG | INFINITY | 0.000000 | |

Table 5 below shows the wave front aberration of the second embodiment deforming the deformable plane mirror 704.

TABLE 5

Best Individual Focus

| Field Fract. | Focus (mm) | RMS(waves) | STREHL |
|---|---|---|---|
| X 0.00 | | | |
| Y 0.00 | 0.000000 | 0.001 | 1.000 |
| X 0.00 | | | |
| Y 0.10 | −0.000001 | 0.001 | 1.000 |
| X 0.00 | | | |
| Y 0.20 | −0.000002 | 0.001 | 1.000 |
| X 0.00 | | | |
| Y 0.30 | −0.000004 | 0.001 | 1.000 |
| X 0.00 | | | |
| Y 0.40 | −0.000007 | 0.001 | 1.000 |
| X 0.00 | | | |
| Y 0.50 | −0.000010 | 0.001 | 1.000 |
| X 0.00 | | | |
| Y 0.60 | −0.000011 | 0.001 | 1.000 |
| X 0.00 | | | |
| Y 0.70 | −0.000007 | 0.001 | 1.000 |
| X 0.00 | | | |
| Y 0.80 | −0.000002 | 0.001 | 1.000 |
| X 0.00 | | | |
| Y 0.90 | −0.000002 | 0.002 | 1.000 |
| X 0.00 | | | |
| Y 1.00 | 0.000015 | 0.002 | 1.000 |

Table 6 below shows the wave front aberrations of the second embodiment after deforming the deformable plane mirror 704.

TABLE 6

Best Individual Focus

| Field Fraction | Focus (mm) | RMS(waves) | STREHL |
|---|---|---|---|
| X 0.00 | | | |
| Y 0.00 | 0.000000 | 0.001 | 1.000 |
| X 0.00 | | | |
| Y 0.10 | −0.000001 | 0.001 | 1.000 |
| X 0.00 | | | |
| Y 0.20 | −0.000002 | 0.001 | 1.000 |
| X 0.00 | | | |
| Y 0.30 | −0.000004 | 0.001 | 1.000 |
| X 0.00 | | | |
| Y 0.40 | −0.000007 | 0.001 | 1.000 |
| X 0.00 | | | |
| Y 0.50 | −0.000008 | 0.001 | 1.000 |
| X 0.00 | | | |
| Y 0.60 | −0.000007 | 0.001 | 1.000 |
| X 0.00 | | | |
| Y 0.70 | −0.000003 | 0.001 | 1.000 |
| X 0.00 | | | |
| Y 0.80 | −0.000001 | 0.001 | 1.000 |
| X 0.00 | | | |
| Y 0.90 | −0.000005 | 0.003 | 1.000 |
| X 0.00 | | | |
| Y 1.00 | 0.000012 | 0.002 | 1.000 |

In summary, the results and advantages of the projection optical system of the present invention can now be more fully realized. The deformable mirror can be deformed to control the high order distortion of the projection optical system to match the distortion of a previous projection optical system in which a semiconductor wafer has been processed.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A projection optical system for projecting an image of a first object onto a second object wherein the projection optical system has a deformable mirror as the first optical element following the first object and wherein the object and where in the following condition is satisfied on the deformable mirror:

$$0.01 < H1/H0 \text{ which is } < 0.22.$$

Where H1 is a distance between an optical axis and a marginal ray at maximum numerical aperature, and H0 is a distance between the optical axis and a chief ray at maximum object height.

2. The projection optical system of claim 1 wherein the projection optical system has a reduction ratio in the range of $-\frac{1}{8}X$ to $-\frac{1}{20}X$.

3. The projection optical system of claim 2 wherein the deformable mirror deforms to an aspherical surface.

4. The projection optical system of claim 3 wherein the optical system further comprises:
    a first group of lens elements having a positive refractive power;
    a second group of lens elements having a negative refractive power;
    a beam splitter;
    a concave mirror; and
    a third group of lens elements having a positive refractive power.

5. The projection optical system of claim 4 wherein the concave mirror acts as an aperture stop.

6. The projection optical system of claim 5 wherein the first object is a reticle.

7. The projection optical system of claim 6 wherein the second object is a wafer.

8. A method of controlling the distortion in a projection optical system, wherein the method comprises the steps of:
    projecting an image of a first object through the projection optical system onto a second object wherein the projection optical system has a deformable mirror as the first optical element following the first object, and wherein the deformable mirror satisfies the the following condition:

$$0.01 < H1/H0 \text{ which is } < 0.22.$$

where H1 is a distance between an optical axis and a marginal ray at maximum numerical aperature, and H0 is a distance between the optical axis and a chief ray at maximum object height.

9. The method of claim 8 wherein the method further comprises projecting the image of the first object through a projection optical system having a reduction ratio in the range of $-\frac{1}{8}X$ to $-\frac{1}{20}X$.

10. The method of claim 9 wherein the deformable mirror deforms to an aspherical surface.

11. The method of claim 10 wherein the image of the first object is projected through a projecting optical system comprising:
    a first group of lens elements having a positive refractive power;
    a second group of lens elements having a negative refractive power;
    a beam splitter;
    a concave mirror; and
    a third group of lens elements having a positive refractive power.

12. The method of claim 11 wherein the concave mirrors acts as an aperture stop.

13. The method of claim 12 wherein the first object is a reticle.

14. The method of claim 13 wherein the second object is a wafer.

15. A projection optical system for projecting an image of a first object onto a second object, comprising:
    a deformable mirror arranged in an optical path between said first object and said second object,
    said deformable mirror satisfying the following condition;

$$0.01 < H1/H0 < 0.22,$$

where H1 is a distance between an optical axis of said projection system and a marginal ray from an axial point of said first object, on said deformable mirror, and H0 is a distance between the optical axis and a chief ray from an off-axial point on the first object, on said deformable mirror.

16. A method of controlling a distortion In a projection optical system, comprising:
    projecting an image of a first object through a projection optical system onto a second object, said projection optical system comprising a deformable mirror which satisfies the following condition:

$$0.01 < H1/H0 < 0.22,$$

where H1 is a distance between an optical axis of said projection system and a marginal ray from an axial point of said first object, on said deformable mirror, and H0 is a distance between the optical axis and a chief ray from an off-axial point on the first object, on said deformable mirror.

17. A projection exposure method for transferring a pattern on a mask onto an object, the method comprising the steps of:
    projecting an image of the mask through a projection optical system having a deformable mirror arranged most maskwise, wherein the deformable mirror controls a distortion of the projection optical system and wherein the deformable mirror satisfies the following condition:

$$0.01 < H1/H0 \text{ which is } < 0.22.$$

Where H1 is a distance between an optical axis of the the projection system and a marginal ray from an axial point of the first object, on the deformable mirror, and H0 is a distance between the optical axis and a chief ray from an off-axial point on the first object, on the deformable mirror.

18. A projection exposure method for transferring a pattern on a mask onto an object, comprising:
    projecting an image of the mask through a projection optical system having a deformable mirror,
    said deformable mirror satisfying the following condition;

$$0.01 < H1/H0 < 0.22,$$

where H1 is a distance between an optical axis of said projection system and a marginal ray from an axial point of said first object, on said deformable mirror, and H0 is a distance between the optical axis and a chief ray from an off-axial point on the first object, on said deformable mirror.

19. The method of claim 18, wherein said deformable mirror controls a distortion of said projection optical system.

* * * * *